US012690148B2

(12) United States Patent　　　　(10) Patent No.:　US 12,690,148 B2
　　Lin et al.　　　　　　　　　　　　(45) Date of Patent:　　　Jul. 21, 2026

---

(54) FOLDABLE ELECTRONIC DEVICE

(71) Applicant: FOSITEK CORPORATION, New Taipei City (TW)

(72) Inventors: Chun-Han Lin, New Taipei City (TW); Yung-Chih Tseng, New Taipei City (TW); Hao-Yun Lee, New Taipei City (TW)

(73) Assignee: FOSITEK CORPORATION, New Taipei City (TW)

( * ) Notice: Subject to any disclaimer, the term of this patent is extended or adjusted under 35 U.S.C. 154(b) by 153 days.

(21) Appl. No.: 18/680,461

(22) Filed: May 31, 2024

(65) Prior Publication Data

US 2025/0301585 A1　　Sep. 25, 2025

(30) Foreign Application Priority Data

Mar. 22, 2024　　(TW) ................................. 113110699

(51) Int. Cl.
　　*H05K 5/00*　　　　(2025.01)
　　*H05K 5/02*　　　　(2006.01)
(52) U.S. Cl.
　　CPC ................................. *H05K 5/0226* (2013.01)
(58) Field of Classification Search
　　CPC ................................. H05K 5/0226; G06F 1/16
　　See application file for complete search history.

(56) References Cited

U.S. PATENT DOCUMENTS

| | | | | |
|---|---|---|---|---|
| 9,348,450 | B1 * | 5/2016 | Kim | H04M 1/0268 |
| 9,474,345 | B2 * | 10/2016 | Smith | H01F 7/0252 |
| 11,229,133 | B2 * | 1/2022 | Kim | H01F 7/0263 |
| 2004/0228668 | A1 * | 11/2004 | Hsu | G06F 3/0221 |
| | | | | 400/472 |
| 2013/0010405 | A1 * | 1/2013 | Rothkopf | H04M 1/0268 |
| | | | | 361/679.01 |
| 2016/0197634 | A1 * | 7/2016 | Lockwood | A45C 11/00 |
| | | | | 455/575.8 |
| 2018/0364761 | A1 * | 12/2018 | Lin | G06F 1/1652 |
| 2019/0258295 | A1 * | 8/2019 | Fujimoto | G09F 9/00 |
| 2020/0236826 | A1 * | 7/2020 | Baek | G06F 1/1681 |
| 2020/0241604 | A1 * | 7/2020 | Nakamura | G06F 1/1618 |
| 2023/0050984 | A1 * | 2/2023 | Chun | G06F 1/1652 |

* cited by examiner

*Primary Examiner* — Imani N Hayman
*Assistant Examiner* — Rashen E Morrison
(74) *Attorney, Agent, or Firm* — Birch, Stewart, Kolasch & Birch, LLP

(57)　　　　　　ABSTRACT

A foldable electronic device includes a first housing part having first magnetic members disposed toward a first inner wall thereof, a second housing part having a second magnetic members disposed toward a second inner wall thereof, at least one hinge connected between the housing parts, and an accessory having third magnetic members disposed toward an attractive wall. In an unfolded state and a transition folded state, the first and third magnetic members are attractive toward each other to hold the accessory on the first housing part. In a fully folded state, the first and second inner walls are close to each other with magnetic attraction of the first and second magnetic members.

3 Claims, 7 Drawing Sheets

FOLDABLE ELECTRONIC DEVICE

CROSS-REFERENCE TO RELATED APPLICATION

This application claims priority to Taiwanese Patent Application No. 113110699, filed on Mar. 22, 2024, and incorporated by reference herein in its entirety.

FIELD

The disclosure relates to an electronic device, and more particularly to a foldable electronic device shiftable among an unfolded state, a transition folded state and a fully folded state.

BACKGROUND

Electronic devices such as foldable phones or tablets have gradually become more popular recently, and hinges used in such foldable electronic devices are mounted between two casings of the foldable electronic device to support a flexible display to unfold or fold the flexible display. As a variety of accessories are used with the foldable electronic devices, there is a need for the accessory to be conveniently retained between the two casings of the foldable electronic device when the flexible display is folded.

SUMMARY

Therefore, an object of the disclosure is to provide a foldable electronic device that can alleviate at least one of the drawbacks of the prior art.

According to the disclosure, the foldable electronic device includes a first housing part, a second housing part, at least one hinge and an accessory. The first housing part has a first inner wall and a first outer wall opposite to each other, and a plurality of first magnetic members which are disposed toward the first inner wall. The second housing part has a second inner wall and a second outer wall opposite to each other, and a plurality of second magnetic members which are disposed toward the second inner wall and respectively correspond with the first magnetic members. The hinge is connected between the first housing part and the second housing part to shift the first housing part and the second housing part among an unfolded state, a transition folded state and a fully folded state. The accessory has an attractive wall and a non-attractive wall opposite to each other, and a plurality of third magnetic members which are disposed toward the attractive wall and respectively correspond with the first magnetic members. In the unfolded state, the first inner wall and the second inner wall face in the same direction, the attractive wall is attached to and faces the first inner wall and the first magnetic members are respectively attractive to the third magnetic members. In the transition folded state, the first inner wall and the second inner wall extend parallel to each other, face each other and are spaced apart from each other to accommodate the accessory therebetween, and the first magnetic members are respectively attractive to the third magnetic members to have the attractive wall be positioned on the first housing part toward the first inner wall. In the fully folded state, the first inner wall and the second inner wall are closer to each other and extend parallel to and face each other, and the first magnetic members are respectively attractive to the second magnetic members.

With the first magnetic members, the second magnetic members and the third magnetic members, the attractive wall of the accessory is disposed on and faces toward the first inner wall in the unfolded state and the transition folded state. In the fully folded state, the first inner wall of the first housing part is prevented from movement away from the second inner wall of the second housing part through the magnetic attraction of the first and second magnetic members.

BRIEF DESCRIPTION OF THE DRAWINGS

Other features and advantages of the disclosure will become apparent in the following detailed description of the embodiment with reference to the accompanying drawings. It is noted that various features may not be drawn to scale.

DETAILED DESCRIPTION

Figure 1:
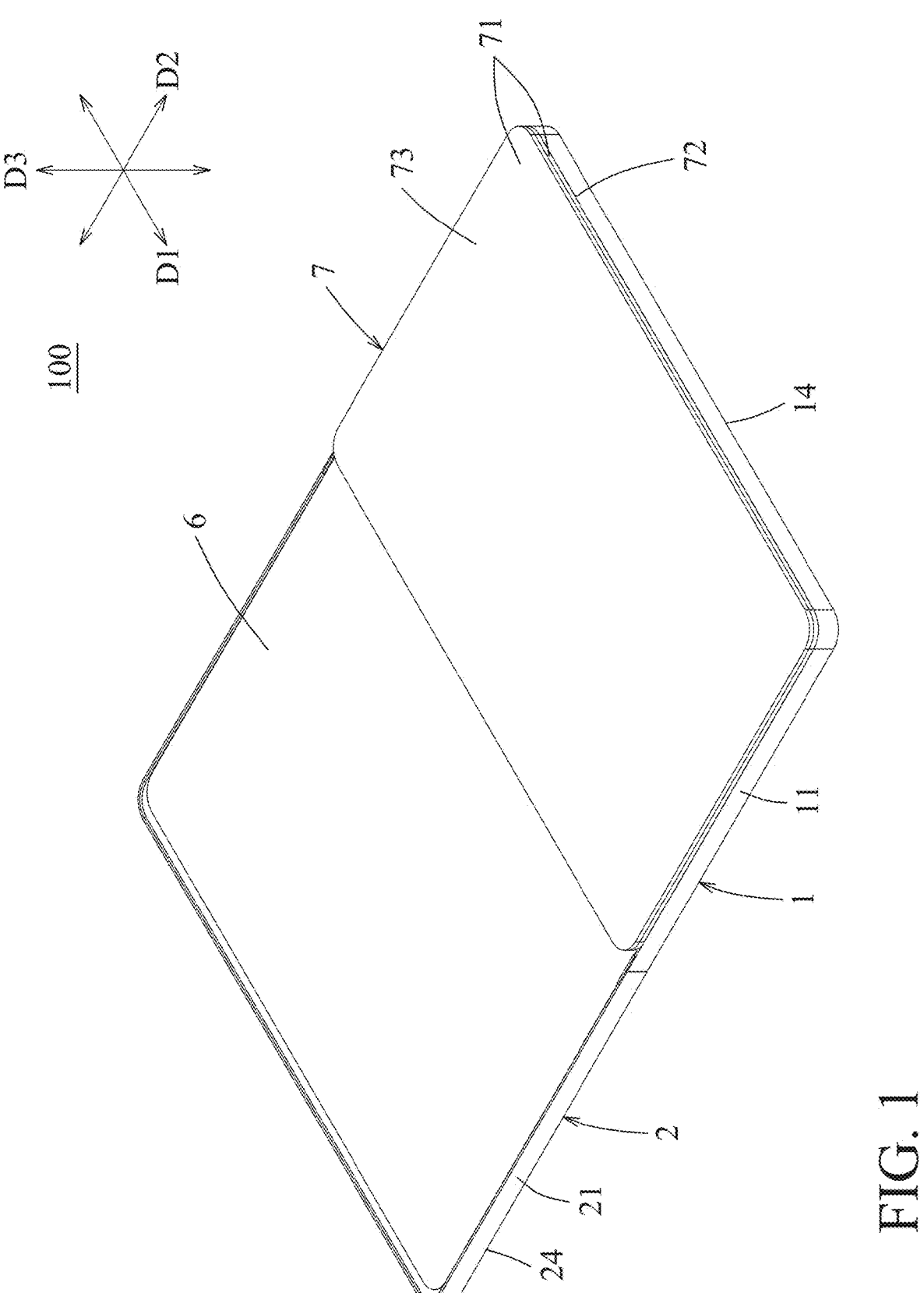
FIG. 1 is a perspective view illustrating an embodiment of a foldable electronic device according to the disclosure.
Figure 2:
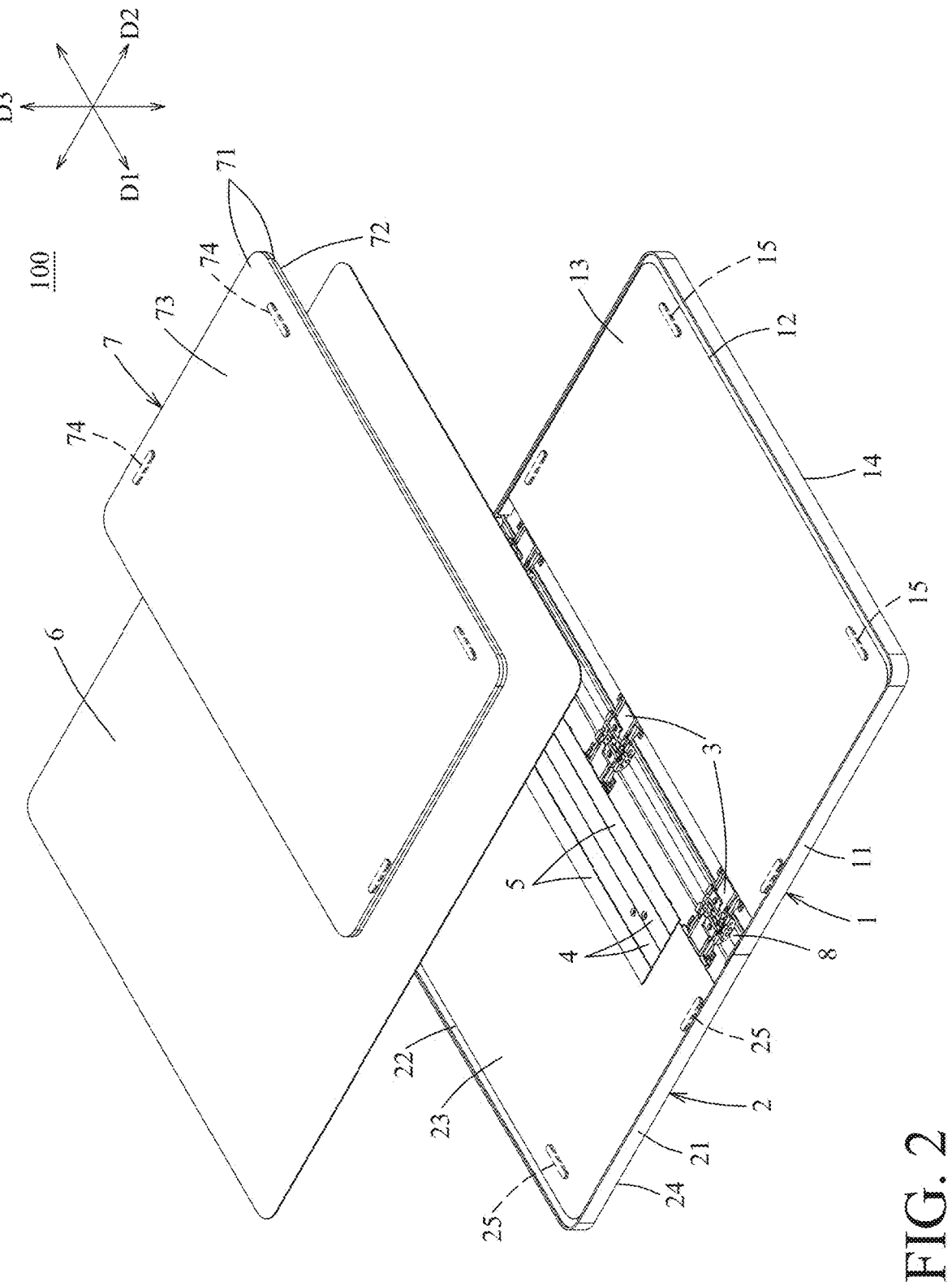
FIG. 2 is an exploded perspective view of the embodiment in FIG. 1.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Referring to FIGS. 1 to 4, an embodiment of a foldable electronic device 100 according to the disclosure includes a first housing part 1, a second housing part 2, a plurality of hinges 3, two first support plates 4, two second support plates 5, a flexible display 6 and an accessory 7. The foldable electronic device 100 may be a tablet PC, a mobile phone, a portable PC, or any electronic device with a flexible display. The accessory 7 may be a keyboard or any auxiliary device or member. In this embodiment, three of the hinges 3 are mounted on a base cover 8, and the number of the hinges 3 may be varied as requirement. The base cover 8 may be dispensed with.

The first housing part 1 extends substantially in both a front-rear direction (D1) and a left-right direction (D2), and has a first housing 11, a third support plate 12 disposed upwardly of the first housing 11 in an up-down direction (D3), a first inner wall 13 disposed on the third support plate 12, and a first outer wall 14 disposed on the first housing 11 such that the first inner wall 13 and the first outer wall 14 are opposite to each other. A plurality of first magnetic members 15 are disposed on the first housing 11 toward the first inner wall 13. In this embodiment, the first magnetic members 15 are disposed adjacent to a peripheral edge of the first inner wall 13.

The second housing part 2 is disposed opposite to the first housing part 1 along the left-right direction (D2), and has a second housing 21, a fourth support plate 22 disposed upwardly of the second housing 21 in the up-down direction (D3), a second inner wall 23 disposed on the fourth support plate 22, and a second outer wall 24 disposed on the second housing 21 such that the second inner wall 23 and the second outer wall 24 are opposite to each other. A plurality of second magnetic members 25 are disposed on the second housing 21 toward the second inner wall 23 to be respectively correspondable and attractive to the first magnetic members 15. In this embodiment, the second magnetic members 25 are disposed adjacent to a peripheral edge of the second inner wall 23.

Figure 7:
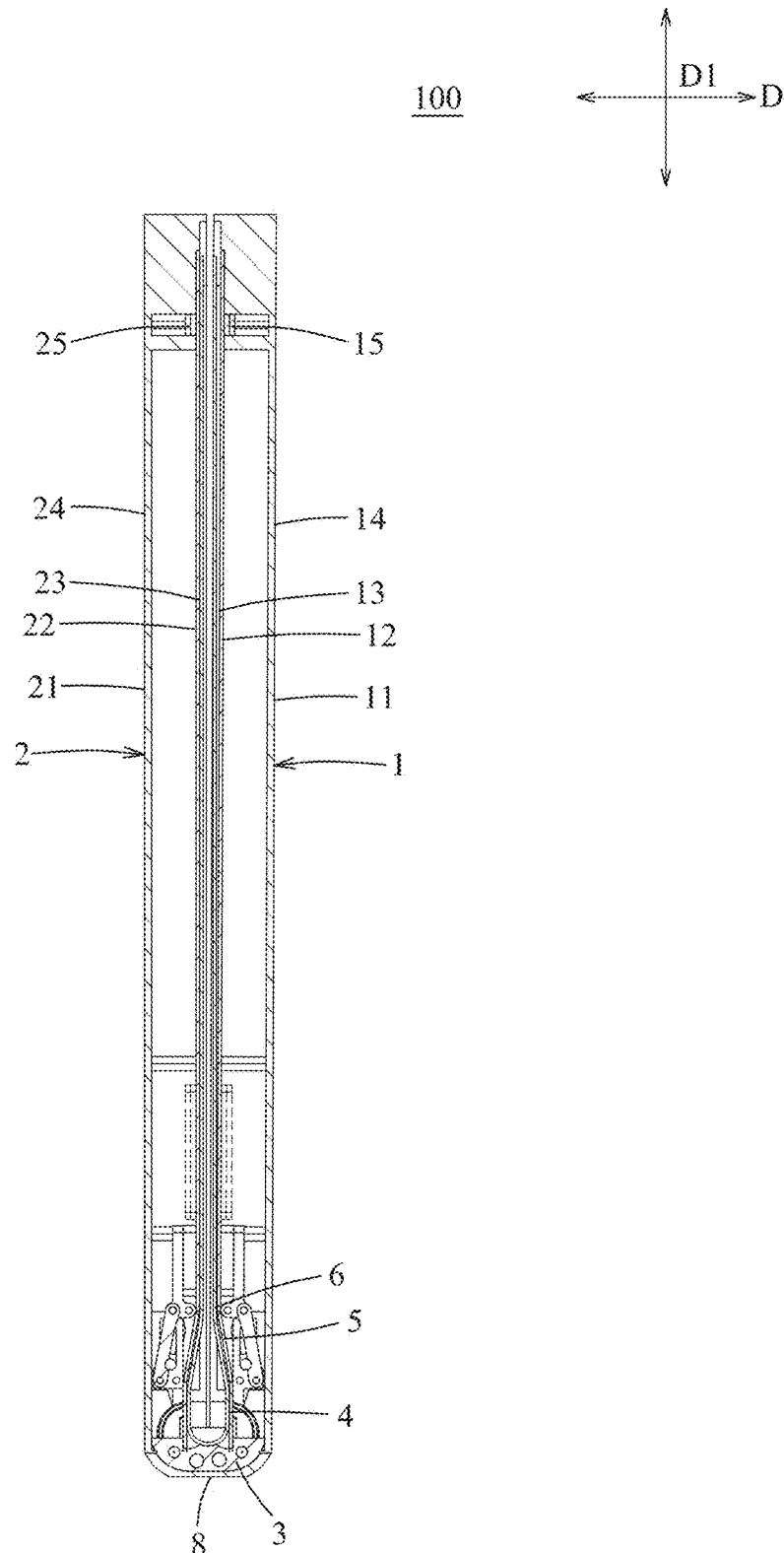
FIG. 7 is a sectional view illustrating the first housing part and the second housing part of the embodiment in a fully folded state and an accessory being removed.

Each of the hinges 3 is connected between the third support plate 12 of the first housing part 1 and the fourth support plate 22 of the second housing part 2 to shift the first housing part 1 and the second housing part 2 among an unfolded state, a transition folded state (see FIG. 5) and a fully folded state (see FIG. 7). Each of the hinges 3 is also connected between the two first support plates 4 and between the two second support plates 5 such that the first, second, third and fourth support plates 4, 5, 12, 22 cooperatively support the flexible display 6.

The accessory 7 has at least one accessory housing 71 which has an attractive wall 72 and a non-attractive wall 73 opposite to each other, and a plurality of third magnetic members 74 which are disposed on the accessory housing 71 toward the attractive wall 72. For example, the non-attractive wall 73 may be a keyboard operating interface. In this embodiment, the number of the accessory housings 71 is two. The attractive wall 72 and the non-attractive wall 73 are respectively disposed on the two accessory housings 71, and the third magnetic members 74 are disposed on one of the accessory housings 71. The third magnetic members 74 are respectively correspondable and attractable with the first magnetic members 15. In this embodiment, the third magnetic members 74 are disposed adjacent to a peripheral edge of the attractive wall 72.

Figure 3:
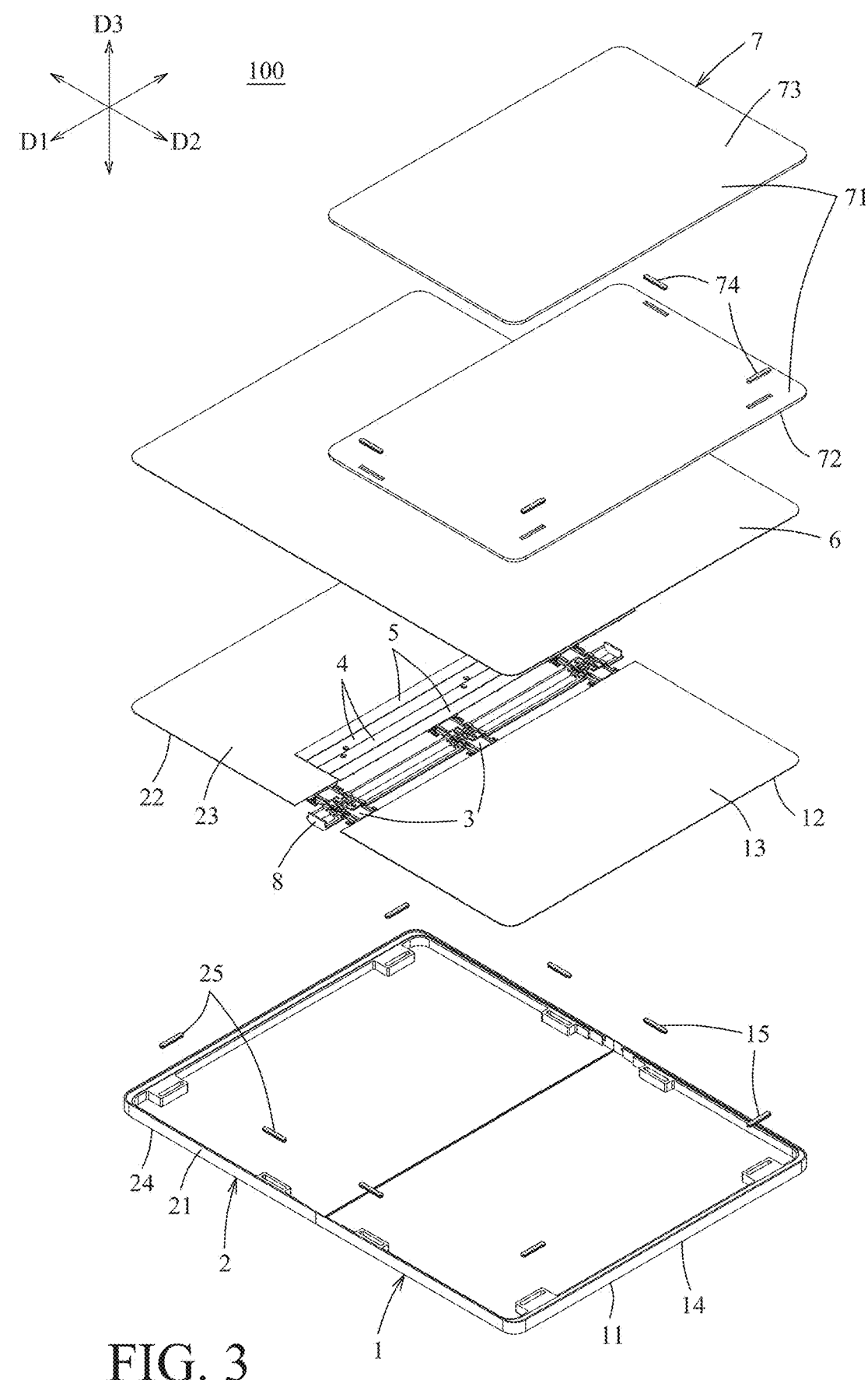
FIG. 3 is a further exploded perspective view of the embodiment in FIG. 1.
Figure 4:
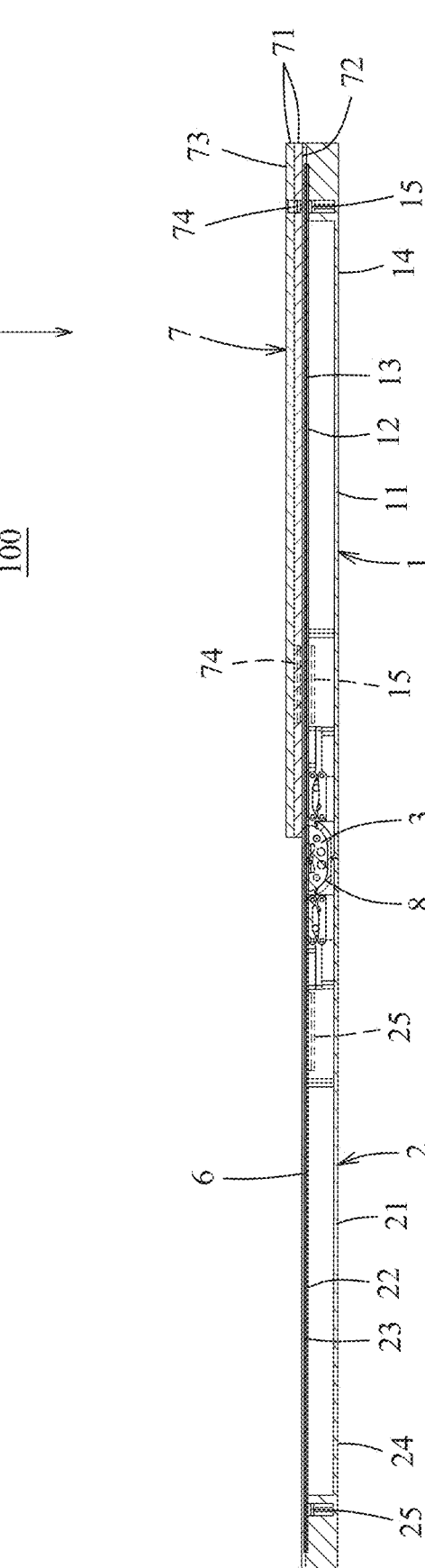
FIG. 4 is a sectional view illustrating a first housing part and a second housing part of the embodiment in an unfolded state.

With reference to FIGS. 3 and 4, in the unfolded state, the first inner wall 13 and the second inner wall 23 face in the same direction (in the up-down direction (D3) in the drawings), the attractive wall 72 of the accessory 7 is attached to and faces the first inner wall 13 and the first magnetic members 15 are respectively attractive to the third magnetic members 74. Since the first magnetic members 15 and the second magnetic members 25 are disposed to have opposite polarities in the up-down direction (D3), the second magnetic members 25 and the third magnetic members 74 will expel each other once the attractive wall 72 of the accessory 7 is moved close to the second inner wall 23 of the second housing part 2, and hence the accessory 7 cannot be retainingly held on the second housing part 2 through attachment of the attractive wall 72 to the second inner wall 23.

Figure 5:
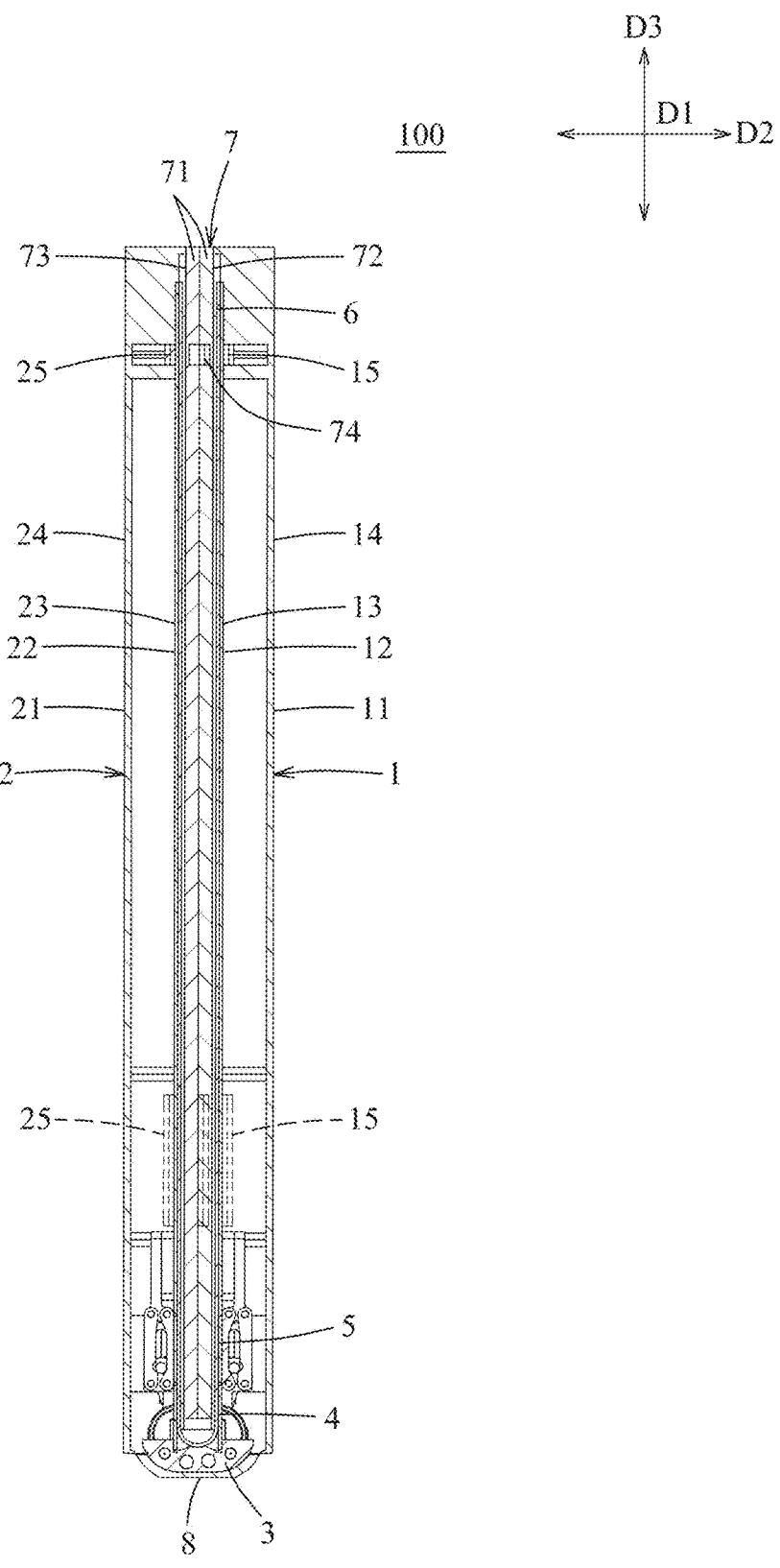
FIG. 5 is a sectional view illustrating the first housing part and the second housing part of the embodiment in a transition folded state.
Figure 6:
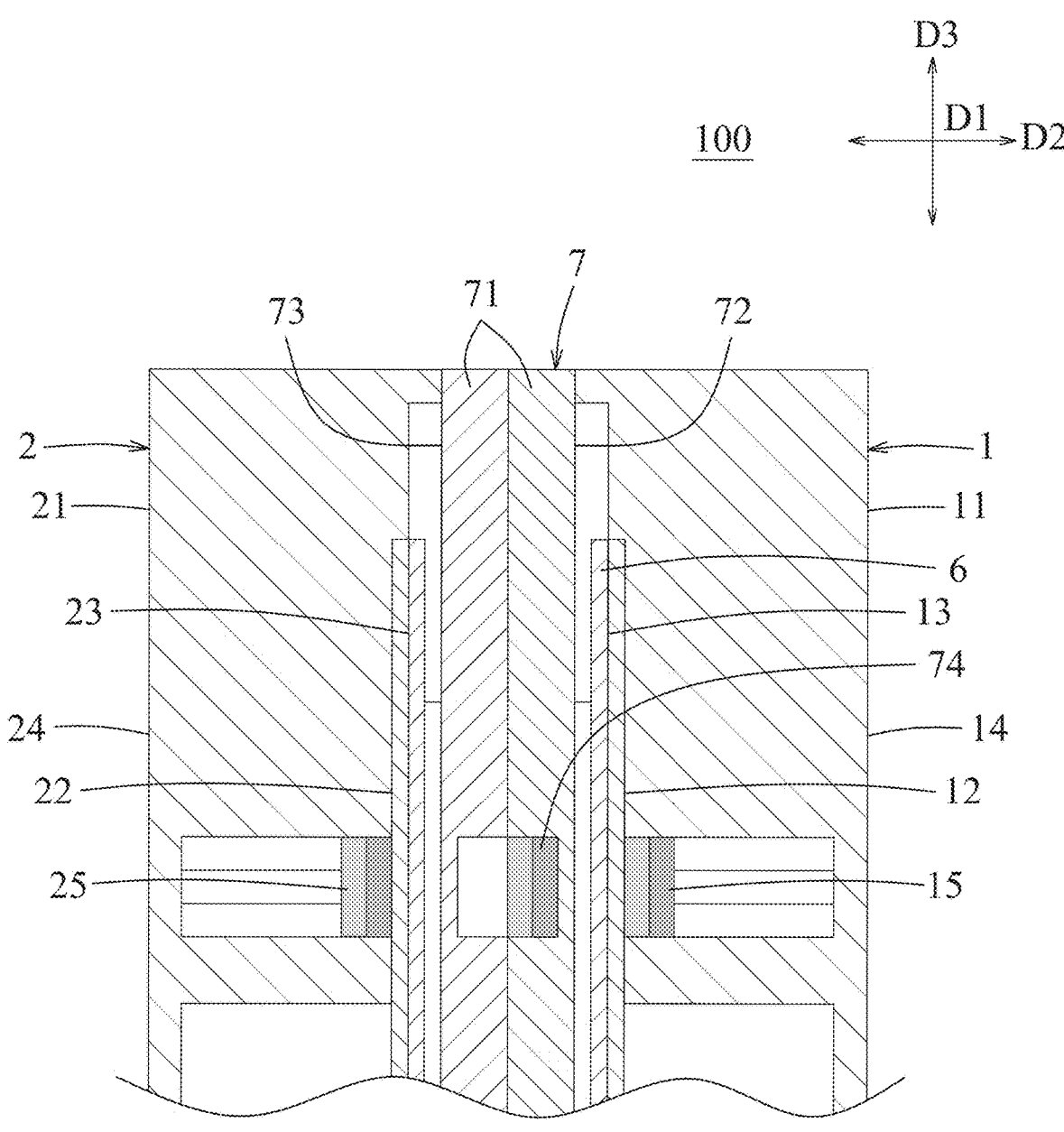
FIG. 6 is a fragmentary sectional view of a portion of FIG. 5, wherein the magnetic poles of magnetic members of the embodiment are shown in different grey scales.

With reference to FIGS. 3, 5 and 6, in the transition folded state, the first inner wall 13 and the second inner wall 23 extend parallel to each other, face each other and are spaced apart from each other to accommodate the accessory 7 therebetween, and the first magnetic members 15 of the first housing part 1 are respectively attractive to the third magnetic members 74 of the accessory 7 to have the attractive wall 72 be positioned on the first housing part 1 toward the first inner wall 13. As shown in FIGS. 5 and 6, in this state, the flexible display 6 is folded with a U-shape cross-section to define a receiving space for receiving the accessory 500 therein. It is noted that, in this state, the second magnetic members 25 and the third magnetic members 74 are magnetically attractive toward each other by a relatively smaller attractive force through the second inner wall 23 and the non-attractive wall 73. As a distance between the second magnetic members 25 and the third magnetic members 74 is larger than a distance between the first magnetic members 15 and the third magnetic members 74, the attractive force generated between the second and third magnetic members 25, 74 is smaller than that between the first and third magnetic members 15, 74. Thus, the accessory 7 is retainingly attached to the first housing 11 during the shifting of the foldable electronic device 100 from the transition folded state to the unfolded state.

With reference to FIGS. 3 and 7, when the accessory 7 is removed from the first housing 11, the foldable electronic device 100 can be shifted from the transition folded state to the fully folded state. In the fully folded state, the first inner wall 13 and the second inner wall 23 are closer to each other and extend parallel to and face each other, and the first magnetic members 15 of the first housing part 1 are respectively attractive to the second magnetic members 25 of the second housing part 2.

As illustrated, with the first magnetic members 15 disposed toward the first inner wall 13 of the first housing part 1, the second magnetic members 25 disposed toward the second inner wall 23 of the second housing part 2 and respectively corresponding with the first magnetic members 15, and the third magnetic members 74 disposed toward the attractive wall 72 of the accessory 7 and respectively corresponding with the first magnetic members 15, the attractive wall 72 of the accessory 7 is disposed on and faces toward the first inner wall 13 in the unfolded state and the transition folded state. In the fully folded state, the first inner wall 13 of the first housing part 1 is prevented from moving away from the second inner wall 23 of the second housing part 2 through the magnetic attraction of the first and second magnetic members 15, 25.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A foldable electronic device, comprising:

a first housing part having a first inner wall and a first outer wall opposite to each other, and a plurality of first magnetic members which are disposed toward said first inner wall;

a second housing part having a second inner wall and a second outer wall opposite to each other, and a plurality of second magnetic members which are disposed toward said second inner wall and respectively correspond with said first magnetic members;

at least one hinge connected between said first housing part and said second housing part to shift said first housing part and said second housing part among an unfolded state, a transition folded state and a fully folded state; and an accessory having an attractive wall and a non-attractive wall opposite to each other, and a plurality of third magnetic members which are disposed toward said attractive wall and respectively correspond with said first magnetic members;

wherein, in the unfolded state, said first inner wall and said second inner wall face in the same direction, said attractive wall is attached to and faces said first inner wall and said first magnetic members are respectively attractive to said third magnetic members;

wherein, in the transition folded state, said first inner wall and said second inner wall extend parallel to each other, face each other and are spaced apart from each other to accommodate said accessory therebetween, and said first magnetic members are respectively attractive to said third magnetic members to have said attractive wall be positioned on said first housing part toward said first inner wall; and wherein, in the fully folded state, said first inner wall and said second inner wall are closer to each other and extend parallel to and face each other, and said first magnetic members are respectively attractive to said second magnetic members.

2. The foldable electronic device of claim 1, wherein said first magnetic members are disposed adjacent to a peripheral edge of said first inner wall, said second magnetic members are disposed adjacent to a peripheral edge of said second inner wall, and said third magnetic members are disposed adjacent to a peripheral edge of said attractive wall.

3. The foldable electronic device of claim 2, wherein, in the transition folded state, a distance between said second magnetic members and said third magnetic members is larger than a distance between said first magnetic members and said third magnetic members.

* * * * *